(12) United States Patent
Mizuyoshi

(10) Patent No.: US 6,570,897 B1
(45) Date of Patent: May 27, 2003

(54) WAVELENGTH CONVERSION APPARATUS USING SEMICONDUCTOR OPTICAL AMPLIFYING ELEMENT FOR LASER OSCILLATION

(75) Inventor: Akira Mizuyoshi, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/521,916

(22) Filed: Mar. 9, 2000

(30) Foreign Application Priority Data

Mar. 9, 1999 (JP) ............................. 11-061653

(51) Int. Cl.[7] ............................. H01S 5/00; H01S 3/10; H01S 3/08
(52) U.S. Cl. ............................. 372/43; 372/21; 372/22; 372/92; 372/99
(58) Field of Search ............................. 372/22, 21, 43, 372/99, 98, 92, 97, 75

(56) References Cited

U.S. PATENT DOCUMENTS

| | | | |
|---|---|---|---|
| 5,363,390 A | 11/1994 | Yang et al. | 372/22 |
| 5,390,210 A * | 2/1995 | Fouquet et al. | 372/92 |
| 5,408,481 A * | 4/1995 | Scheps | 372/22 |
| 5,412,674 A * | 5/1995 | Scheps | 372/22 |

* cited by examiner

Primary Examiner—Paul Ip
Assistant Examiner—Armando Rodriguez
(74) Attorney, Agent, or Firm—Sughrue Mion, PLLC

(57) ABSTRACT

A wavelength conversion apparatus contains a semiconductor laser device as an excitation light source, a semiconductor optical amplifying element, a resonator formed by the optical amplifying element and a mirror arranged outside the optical amplifying element, and a wavelength conversion element arranged in the resonator. The semiconductor laser device emits excitation laser light which is supplied to the semiconductor optical amplifying element. The semiconductor optical amplifying element has an active layer on a substrate thereof, and is excited by the excitation laser light to emit laser light. Then, the laser light emitted by the semiconductor optical amplifying element is converted by the wavelength conversion element to reduce the wavelength to half.

33 Claims, 4 Drawing Sheets

Stripe width

WAVELENGTH CONVERSION APPARATUS USING SEMICONDUCTOR OPTICAL AMPLIFYING ELEMENT FOR LASER OSCILLATION

BACKGROUND OF THE INVENTION

1. Field of the Invention

The present invention relates to a wavelength conversion apparatus which uses a wavelength conversion element and a semiconductor laser device as an excitation light source.

2. Description of the Related Art

Conventional wavelength conversion apparatuses use laser optical crystals such as Nd-doped YAG, Nd-doped $YVO_4$, Nd-doped YLF, or the like. Each of the laser optical crystals is excited by a semiconductor laser device which emits laser light having a wavelength band broader than an absorption band of the laser optical crystal, and a wavelength of the laser light emitted by the laser optical crystal is converted by a nonlinear crystal or a wavelength conversion element such as domain-inverted $LiNbO_3$. As a result of the conversion, for example, the wavelength of the laser light emitted by the laser optical crystal is reduced to half.

Typically, a laser optical crystal of YAG is excited by excitation laser light having a wavelength of 809 nm, which is emitted by a wide-beam semiconductor laser device, and thus laser light having a wavelength of 946 nm is emitted. Then, blue light having a wavelength of 473 nm is obtained as a second harmonic wave by a wavelength conversion element made of, for example, domain-inverted $LiNbO_3$. However, since mode control is insufficient in the wide-beam semiconductor laser device, mode hopping occurs. Therefore, light output power fluctuates even under a constant driving current, and an unignorable amount of noise (represented by a ratio of RF noise intensity and DC noise intensity of the optical output) is produced. In addition, even in the longitudinal mode, the full width at half maximum of the oscillation wavelength of the wide-beam semiconductor laser device increases with increase in the light output power. For example, the full width at half maximum exceeds 2 nm even if the light output power is in the range of 200 to 500 mW.

Nevertheless, the absorption coefficient of the YAG crystal for the light of 809 nm is small, and the absorption band including the wavelength of 809 nm is narrow (2 nm). In addition, due to the noise of the semiconductor laser device, the output laser light having the wavelength of 946 nm also includes noise. Further, due to the mode hopping in the wide-beam semiconductor laser device, wavelengths of a portion of the output laser light of the wide-beam semiconductor laser device are not within the absorption band of the YAG crystal, and such a portion of the laser light also increases noise. Furthermore, the noise in the laser light of 946 nm causes noise in the blue light output from the wavelength conversion element.

In addition, the above narrow absorption band of the laser optical crystal must be adjusted to the wavelength band of the output of the semiconductor laser device in the conventional wavelength conversion apparatus. Therefore, precise temperature control is necessary in order to achieve the adjustment.

Further, since the laser optical crystals utilize transitions in doped rare earth elements, only limited wavelengths can be obtained from the laser optical crystals. Therefore, the second harmonic waves obtained by converting the wavelengths of the laser light emitted by the laser optical crystals also have only limited wavelengths.

Furthermore, when modulation of the second harmonic wave is required, the modulation may be realized by directly modulating the semiconductor laser device as the excitation light source, instead of modulation of the modulation of the second harmonic wave per se by using an acoustooptic (AO) modulator or the like. In the case of the direct modulation of the semiconductor laser device, the width of oscillated wavelength of the semiconductor laser device is readily broadened to be more than 2 nm, i.e., greater than the absorption band of the YAG crystal as the laser optical crystal. Therefore, the efficiency is lowered. In addition, since the optical output of the semiconductor laser device becomes a broadened longitudinal mode, the output optical power varies due to mode competition. Thus, according to the conventional technique, the modulated, wavelength-converted light cannot be made stable and the conventional wavelength conversion apparatuses are not efficient.

As described above, since the conventional wavelength conversion apparatuses use laser optical crystals having narrow absorption bands, output light of excitation light sources cannot be utilized efficiently, and noise is produced. Therefore, the conventional wavelength conversion apparatuses are not suitable for obtaining stable optical output on a long-term basis. In addition, according to the conventional wavelength conversion apparatuses, obtainable wavelengths are limited by the laser optical crystals used in the wavelength conversion apparatuses, and therefore it is impossible to obtain an arbitrary wavelength in the visible and ultraviolet ranges.

SUMMARY OF THE INVENTION

The object of the present invention is to provide a wavelength conversion apparatus which can efficiently output stable laser light having an arbitrary wavelength on a long-term basis, without the need for precise temperature control.

According to the present invention, there is provided a wavelength conversion apparatus containing an excitation light source which includes a semiconductor laser device having an active layer, and emits first laser light; an optical amplifying element which is excited by the first laser light to emit second laser light; a resonator formed by the optical amplifying element and a mirror arranged outside the optical amplifying element; and a wavelength conversion element arranged in the resonator. In the wavelength conversion apparatus, the optical amplifying element is a semiconductor optical amplifying element having an active layer on a substrate thereof.

The wavelength conversion apparatus according to the present invention uses the semiconductor optical amplifying element having an active layer on a substrate thereof, instead of the laser optical crystal. Since, generally, absorption bands of semiconductor optical amplifying elements are broader than the wavelength band of the semiconductor laser device as the excitation light source, and absorption coefficients of the semiconductor optical amplifying elements are greater than those of the laser optical crystals, the semiconductor optical amplifying element in the wavelength conversion apparatus according to the present invention can efficiently absorb the excitation light (first laser light) which is output from the semiconductor laser device. Therefore, a stable optical output can be obtained from the wavelength conversion apparatus according to the present invention, and noise in the optical output is reduced.

In addition, in the wavelength conversion apparatus according to the present invention, precise temperature control is unnecessary, while such precise temperature control is necessary in the conventional wavelength conversion apparatus for adjusting the absorption band of the laser optical crystal to the oscillation wavelength band of the semiconductor laser device.

When semiconductor material forming the active layer of the semiconductor optical amplifying element is appropriately chosen, and the composition of the semiconductor material is appropriately controlled, for example, as described later in paragraph (5) of the additional features, the semiconductor optical amplifying element can emit laser light having an arbitrary wavelength in the range from 750 nm to 1,400 nm. Therefore, an optical output having an arbitrary wavelength in the range from 375 nm to 700 nm can be obtained by the wavelength conversion element as a second harmonic wave.

Further, since, in the wavelength conversion apparatus according to the present invention, the semiconductor optical amplifying element is used instead of the laser optical crystal, stable modulated laser light can also be obtained as the second harmonic wave even when the modulation is realized by directly modulating the semiconductor laser device as the excitation light source.

The wavelength conversion apparatus according to the present invention may have the following additional features:

(1) In the above wavelength conversion apparatus according to present invention, the wavelength of the first laser light is preferably shorter than the wavelength of the second laser light.

(2) In the above wavelength conversion apparatus according to present invention, the mirror may be a concave mirror, and is preferably arranged so that the focal plane of light reflected by the mirror is located inside the semiconductor optical amplifying element.

(3) In the above wavelength conversion apparatus according to present invention, the active layer of the semiconductor laser device is preferably made of at least one of $Al_xGa_{1-x}As$ ($0 \leq x \leq 0.4$), $GaAs_xP_{1-x}$ ($0 \leq x \leq 0.4$), $In_{xGa1-x}As_yP_{1-y}$ ($0 \leq x \leq 0.4$, $0.7 \leq y \leq 1$), $In_xGa_{1-x}As$ ($0 \leq x \leq 0.5$), and $In_xAl_yGa_{1-x-y}As$ ($0 \leq x \leq 0.5$, $0 \leq y \leq 0.4$).

(4) In the above wavelength conversion apparatus according to present invention, the stripe width of the active layer of the semiconductor laser device is preferably at least 3 μm.

(5) In the above wavelength conversion apparatus according to present invention, the active layer of the semiconductor optical amplifying element is preferably made of at least one of direct gap semiconductor crystals of $Al_xGa_{1-x}As$ ($0 \leq x \leq 0.4$), $GaAs_xP_{1-x}$ ($0 \leq x \leq 0.4$), $In_xGa_{1-x}As_yP_{1-y}$ ($0 \leq x \leq 0.4$, $0.7 \leq y \leq 1$), $In_xGa_{1-x}As$ ($0 \leq x \leq 0.5$), and $In_xAl_yGa_{1-x-y}As$ ($0 \leq x \leq 0.5$, $0 \leq y \leq 0.4$), InP, and InAlGaAsP.

(6) In the above wavelength conversion apparatus according to present invention, at least one active layer, including the above-mentioned active layer of the semiconductor optical amplifying element, is preferably arranged at a location in which electric field strength of a standing wave generated in the semiconductor optical amplifying element is great.

(7) In the above wavelength conversion apparatus according to the present invention, a dielectric film may be provided on a light-exit end surface of the semiconductor optical amplifying element.

(8) In the wavelength conversion apparatus described in the above paragraph (7), the dielectric film is preferably made of at least one of $SiO_2$, $Al_2O_3$, $TiO_2$, $SiN_4$, and Si.

(9) In the wavelength conversion apparatus described in the above paragraph (7), the dielectric film may be formed by ECR (electron cyclotron resonance) sputtering.

(10) In the above wavelength conversion apparatus according to present invention, the active layer of the semiconductor optical amplifying element is preferably located only in a portion which the first laser light enters, and has a structure for blocking the first laser light from portions other than the above portion which the first laser light enters.

(11) In the above wavelength conversion apparatus according to present invention, the active layer of the semiconductor optical amplifying element has at least one quantum well structure.

(12) In the above wavelength conversion apparatus according to present invention, a portion of the semiconductor optical amplifying element other than the active layer thereof is preferably doped with impurity of at least $5 \times 10^{17}$ cm$^{-3}$ to make the portion a p type or an n type.

(13) In the above wavelength conversion apparatus according to present invention, the semiconductor optical amplifying element may have a periodic structure on a side, opposite to a light-exit end surface, of the active layer of the semiconductor optical amplifying element, where the periodic structure reflects light generated by the semiconductor optical amplifying element with high reflectance.

(14) In the wavelength conversion apparatus described in the above paragraph (13), the periodic-structure is preferably made of at least two semiconductor materials having different refraction indexes, and optical absorption coefficients of the at least two semiconductor materials are at most $5 \times 10^2$ for a wavelength of light generated in the semiconductor optical amplifying element.

(15) In the above wavelength conversion apparatus according to present invention, the semiconductor optical amplifying element may be supplied with the first laser light from the substrate side of the semiconductor optical amplifying element, and emits the second laser light from the side opposite to the substrate in a direction perpendicular to the substrate.

(16) In the wavelength conversion apparatus described in the above paragraph (15), the semiconductor optical amplifying element may have a dielectric film on a light-entrance side of the semiconductor optical amplifying element.

(17) In the wavelength conversion apparatus described in the above paragraph (15), a reflectance of a light-entrance end surface of the semiconductor optical amplifying element is preferably at most 30% at a wavelength of the first laser light, and at least 50% at a wavelength of the second laser light.

(18) In the wavelength conversion apparatus described in the above paragraph (15), a reflectance of a light-exit end surface of the semiconductor optical amplifying element is preferably at most 30% at a wavelength of the second laser light.

(19) In the above wavelength conversion apparatus according to present invention, the semiconductor optical amplifying element may emit the second laser light from a surface of the semiconductor optical amplifying element in a direction perpendicular to a substrate, and the first laser light may enter the semiconductor optical amplifying element from the same surface of the semiconductor optical amplifying element.

(20) In the wavelength conversion apparatus described in the above paragraph (19), a reflectance of the above surface of the semiconductor optical amplifying element is preferably at most 30% at a wavelength of the first laser light, and at most 30% at a wavelength of the second laser light.

(21) In the wavelength conversion apparatus described in the above paragraph (19), the first laser light may enter the semiconductor optical amplifying element in a slanting direction with respect to the substrate of the semiconductor optical amplifying element.

(22) The wavelength conversion apparatus described in the above paragraph (19) may further contain a beam splitter on an optical path of the second laser light, where the beam splitter may supply the first laser light to the semiconductor optical amplifying element in a direction perpendicular to the substrate of the semiconductor optical amplifying element.

(23) In the wavelength conversion apparatus described in the above paragraph (21), the first laser light is preferably incident on a light-entrance end surface of the semiconductor optical amplifying element as a substantially p-polarized light.

(24) In the wavelength conversion apparatus described in the above paragraph (21), an incident angle of the first laser light on a light-entrance end surface of the semiconductor optical amplifying element is preferably within ±10 degrees of the Brewster's angle.

(25) The above wavelength conversion apparatus according to present invention may further contain a filter in a common optical path of the second laser light and light which is preferably reflected by the mirror and converted by the wavelength conversion element.

(26) In the wavelength conversion apparatus described in the above paragraph (25), the filter is preferably one of a birefringent filter, an etalon, and a dielectric filter.

(27) In the above wavelength conversion apparatus according to present invention, a reflectance of a light-entrance end surface of the wavelength conversion element is preferably at most 30% at a wavelength of the first laser light.

(28) In the above wavelength conversion apparatus according to present invention, a reflectance of a light-exit end surface of the wavelength conversion element is preferably at most 30% at a wavelength of wavelength-converted light which is generated by conversion by the wavelength conversion element.

(29) In the above wavelength conversion apparatus according to present invention, the semiconductor laser device may be driven by applying a direct current and a high-frequency current thereto.

(30) In the above wavelength conversion apparatus according to present invention, the semiconductor laser device may be driven by applying a pulsed current thereto.

(31) In the above wavelength conversion apparatus according to present invention, the semiconductor laser device may be driven by applying a direct current and a pulsed current thereto.

(32) In the above wavelength conversion apparatus according to present invention, the semiconductor optical amplifying element may be caused to emit the second laser light by applying a current thereto from outside, in addition to supply of the first laser light thereto.

DESCRIPTION OF PREFERRED EMBODIMENTS

Embodiments of the present invention are explained in detail below with reference to drawings.

First Embodiment

Figure 1:
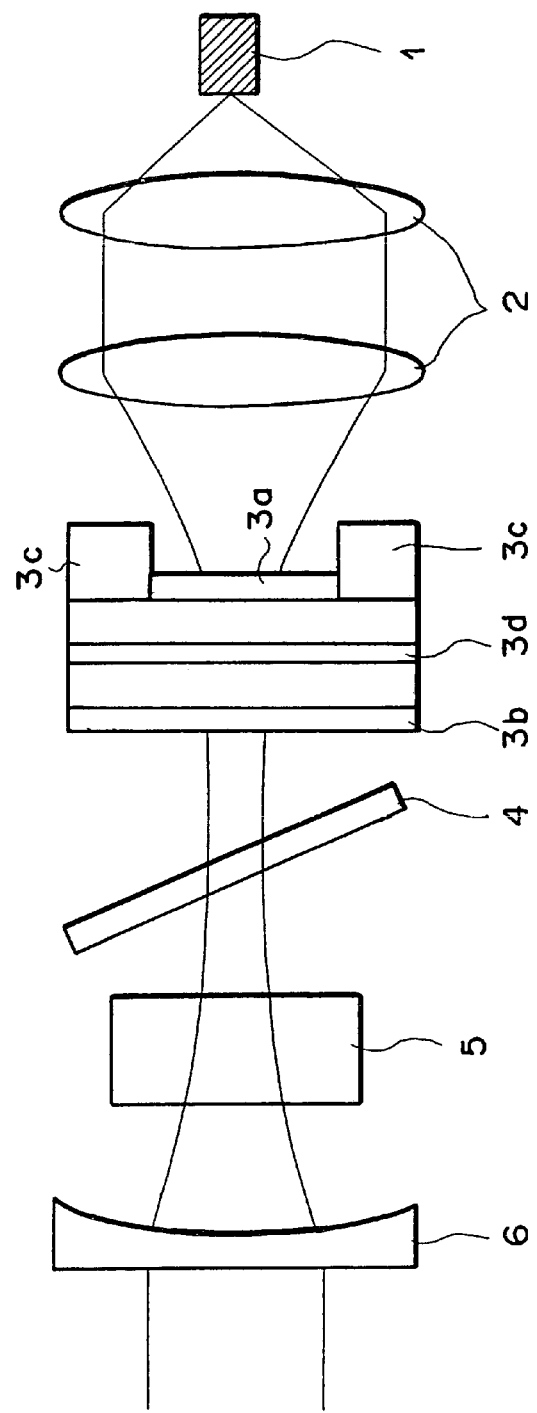
FIG. 1 is a diagram illustrating the construction of the wavelength conversion apparatus as the first embodiment of the present invention.

FIG. 1 is a diagram illustrating the construction of the wavelength conversion apparatus as the first embodiment of the present invention. In the construction of FIG. 1, excitation laser light is supplied to the back end surface of the semiconductor optical amplifying element.

As illustrated in FIG. 1, the excitation laser light emitted by the semiconductor laser device 1 (as an excitation light source) is collected and converged by the lens system 2, and enters the active layer 3d of the semiconductor optical amplifying element 3 from the back end surface in the direction perpendicular to the substrate 3c thereof. Excited by the excitation laser light, the semiconductor optical amplifying element 3 emits laser light. The laser light emitted by the semiconductor optical amplifying element 3 passes through the birefringent filter 4 and the wavelength conversion element 5, and reaches the concave mirror 6. The birefringent filter 4 is provided for controlling the longitudinal mode of the laser light emitted by the semiconductor optical amplifying element 3. The wavelength conversion element 5 is made of, domain-inverted $LiNbO_3$ doped with MgO, and converts the laser light emitted by the semiconductor optical amplifying element 3 into wavelength-converted laser light so as to reduce the wavelength to half. The concave mirror 6 reflects the laser light emitted by the semiconductor optical amplifying element 3 to feed it back to the semiconductor optical amplifying element 3, and lets the above wavelength-converted laser light pass through the concave mirror 6 to output the wavelength-converted laser light from the wavelength conversion apparatus. A periodic-structure dielectric film 3b is provided on the light-exit surface of the semiconductor optical amplifying element 3. The concave mirror 6 is arranged so that the focal plane of the concave mirror 6 is located inside the semiconductor optical amplifying element 3, i.e., beyond the periodic-structure dielectric film 3b of the semiconductor optical amplifying element 3, so that the efficiency of light emission in the semiconductor optical amplifying element 3 is improved.

In addition, the semiconductor optical amplifying element 3 has another periodic-structure dielectric film 3a on the back end surface thereof. The reflectance of the excitation laser light at the periodic-structure dielectric film 3a is at most 30%, and is preferably less than or equal to 1%, so that the excitation laser light from the semiconductor laser device 1 can efficiently enter the semiconductor optical amplifying element 3. The reflectance of the laser light generated in the semiconductor optical amplifying element 3, at the periodic-structure dielectric film 3a, is at least 30%, and is preferably more than or equal to 95%, so that the laser light generated in the semiconductor optical amplifying element 3 can be sufficiently reflected by the periodic-structure dielectric film 3a.

Otherwise, a multilayered semiconductor mirror may be used instead of the periodic-structure dielectric film 3a.

In addition, the incident angle of the excitation laser light on the light-entrance surface of the semiconductor optical amplifying element 3 may not be perpendicular to the light-entrance surface, i.e., may be an oblique angle.

As described above, by using a semiconductor optical amplifying element, which has a broader absorption band and a greater absorption coefficient for excitation laser light, than the conventional laser optical crystals, the excitation laser light can be efficiently absorbed by the semiconductor optical amplifying element. Therefore, a stable optical output can be obtained, noise can be reduced, and precise temperature control is unnecessary for adjusting the absorption band of the semiconductor optical amplifying element to the oscillation wavelength band of the semiconductor laser device.

Second Embodiment

Figure 2:
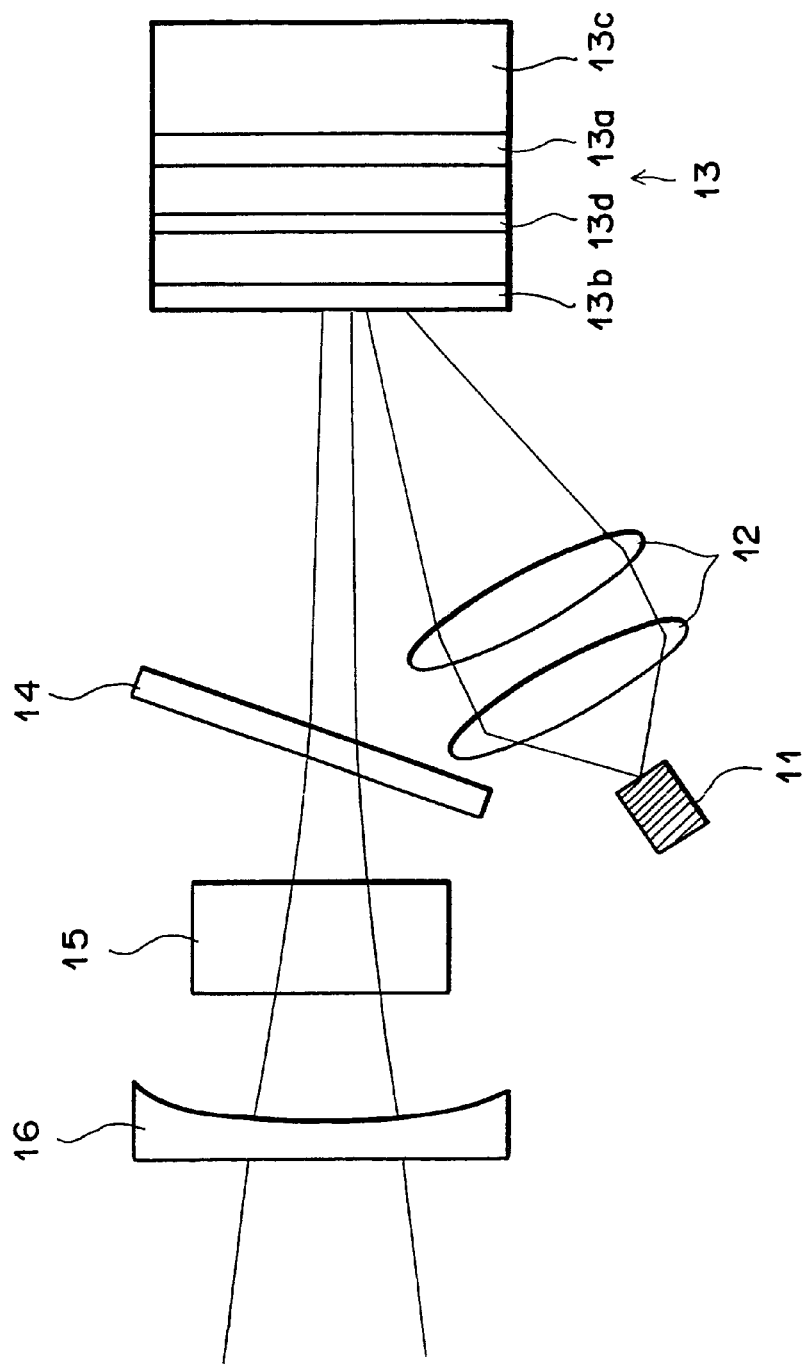
FIG. 2 is a diagram illustrating the construction of the wavelength conversion apparatus as the second embodiment of the present invention.

FIG. 2 is a diagram illustrating the construction of the wavelength conversion apparatus as the second embodiment of the present invention. In the construction of FIG. 2, excitation laser light enters the semiconductor optical amplifying element from a surface through which laser light generated by the semiconductor optical amplifying element exits from the semiconductor optical amplifying element.

As illustrated in FIG. 2, the excitation laser light emitted by the semiconductor laser device 11 (as an excitation light source) is collected and converged by the lens system 12, and enters the active layer 13d of the semiconductor optical amplifying element 13 through the periodic-structure dielectric film 13b, where the incident angle of the excitation laser light on the periodic-structure dielectric film 13b is exactly or nearly the Brewster's angle, i.e., the excitation laser light entering the semiconductor optical amplifying element 13 is substantially p-polarized light. When the incident angle of the excitation laser light on the periodic-structure dielectric film 13b is exactly or nearly the Brewster's angle, the semiconductor optical amplifying element 13 can efficiently absorb the excitation laser light from the semiconductor laser device 11. Excited by the excitation laser light, the semiconductor optical amplifying element 13 emits laser light from the above surface through which the excitation laser light enters the semiconductor optical amplifying element 13. The laser light emitted by the semiconductor optical amplifying element 13 passes through the etalon 14 and the wavelength conversion element 15, and reaches the concave mirror 16. The etalon 14 is provided for controlling the longitudinal mode of the laser light emitted by the semiconductor optical amplifying element 13. The wavelength conversion element 15 converts the laser light emitted by the semiconductor optical amplifying element 13 into wavelength-converted laser light so as to reduce the wavelength to half. The concave mirror 16 reflects the laser light emitted by the semiconductor optical amplifying element 13 to feed it back to the semiconductor optical amplifying element 13, and lets the above wavelength-converted laser light pass through the concave mirror 16 to output the wavelength-converted laser light from the wavelength conversion apparatus.

A periodic-structure dielectric film 13b is provided on the above surface through which the excitation laser light enters the semiconductor optical amplifying element 13, and the laser light generated by the semiconductor optical amplifying element 13 is emitted. The reflectances of the periodic-structure dielectric film 13b at wavelengths of the excitation laser light and the laser light generated in the semiconductor optical amplifying element 13 are at most 30%, and are preferably at most 1%.

In addition, the semiconductor optical amplifying element 13 has a periodic-structure semiconductor mirror 13a on the side formed on a substrate 13c, opposite to the above surface, of an active layer of the semiconductor optical amplifying element 13. The reflectances of the periodic-structure semiconductor mirror 13a at wavelengths of the excitation laser light and the laser light generated in the semiconductor optical amplifying element 13 are at least 30%, and are preferably at least 95%.

Further, the wavelength conversion element 15 is preferably made of KTP (KTiOPO$_4$), KN (KNbO$_3$), domain-inverted LiNbO$_3$, or the like.

Thus, the construction of FIG. 2 has substantially the same advantages as the construction of FIG. 1.

Third Embodiment

Figure 3:
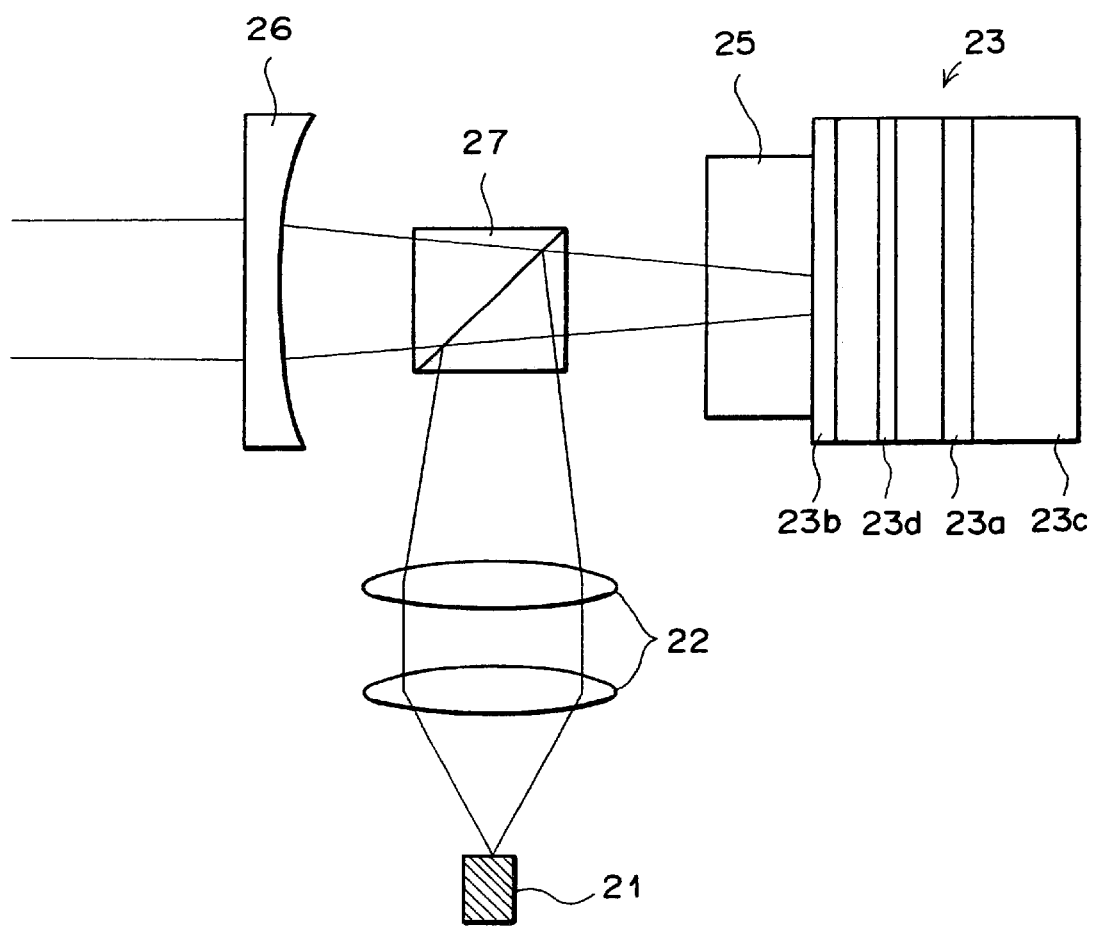
FIG. 3 is a diagram illustrating the construction of the wavelength conversion apparatus as the third embodiment of the present invention.

FIG. 3 is a diagram illustrating the construction of the wavelength conversion apparatus as the third embodiment of the present invention. In the construction of FIG. 3, excitation laser light from the semiconductor laser device is supplied through a beam splitter to the semiconductor optical amplifying element. The excitation laser light enters the semiconductor optical amplifying element from a surface through which laser light generated by the semiconductor optical amplifying element exits from the semiconductor optical amplifying element.

As illustrated in FIG. 3, the excitation laser light emitted by the semiconductor laser device 21 (as an excitation light source) is collected and converged by the lens system 22, is reflected by the beam splitter 27, and enters the active layer 23d of the semiconductor optical amplifying element 23 through the wavelength conversion element 25 and the periodic-structure dielectric film 23b in the direction perpendicular to the substrate 23c of the semiconductor optical amplifying element 23. In the construction of FIG. 3, the wavelength conversion element 25 is immediately coupled to the semiconductor optical amplifying element 23, as illustrated. Excited by the excitation laser light, the semiconductor optical amplifying element 23 emits laser light from the above surface through which the excitation laser light enters the semiconductor optical amplifying element 23. The laser light emitted by the semiconductor optical amplifying element 23 passes through the wavelength conversion element 25 and the beam splitter 27, and reaches the concave mirror 26. The wavelength conversion element 25 converts the laser light emitted by the semiconductor optical amplifying element 23 into wavelength-converted laser light so as to reduce the wavelength to half. The concave mirror 26 reflects the laser light emitted by the semiconductor optical amplifying element 23 to feed it back to the semiconductor optical amplifying element 23, and lets the above wavelength-converted laser light pass through the concave mirror 26 to output the wavelength-converted laser light from the wavelength conversion apparatus.

Similar to the second embodiment (as illustrated in FIG. 2), a periodic-structure dielectric film 23b is provided on the above surface through which the excitation laser light enters the semiconductor optical amplifying element 23, and the laser light generated by the semiconductor optical amplifying element 23 is emitted. Also, similar to the second embodiment, the semiconductor optical amplifying element 23 has a periodic-structure semiconductor mirror 23a on the side, opposite to the above surface, of an active layer of the semiconductor optical amplifying element 23.

Preferably, the wavelength conversion element 25 is made of KTP (KTiOPO$_4$), KN (KNbO$_3$), domain-inverted LiNbO$_3$, or the like.

Thus, the construction of FIG. 3 has substantially the same advantages as the constructions of FIGS. 1 and 2.

Figure 4:
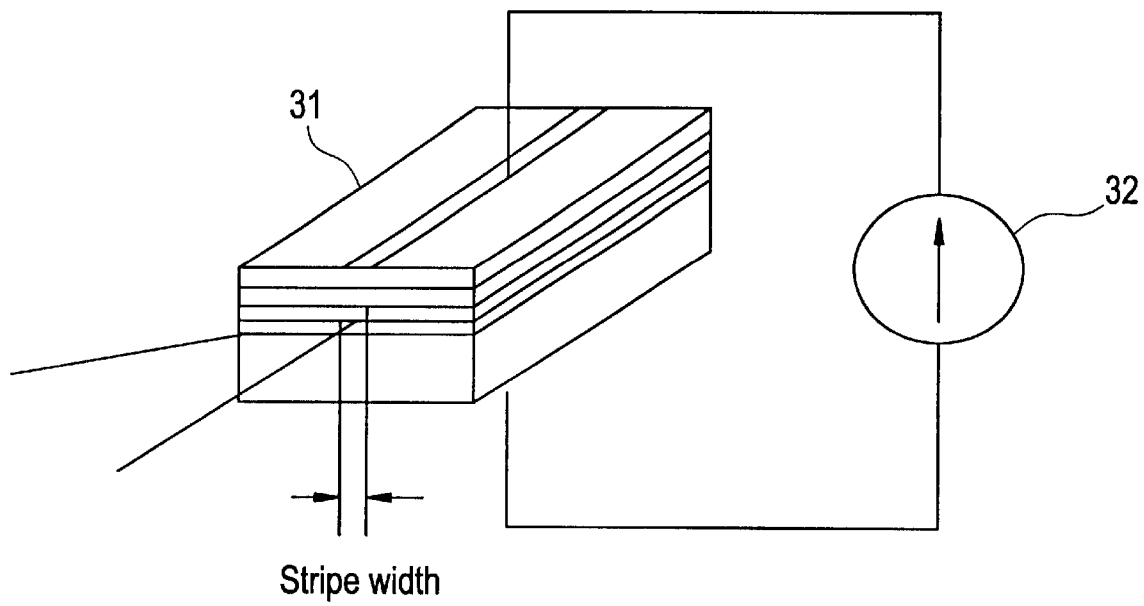
FIG. 4 shows a semiconductor laser device 31, which depicts the stripe width of the active layer of the semiconductor laser device 31 and a current source 32 for applying a desired current to the semiconductor laser device 31.

FIG. 4 shows a semiconductor laser device 31, which depicts the stripe width of the active layer of the semiconductor laser device 31 and a current source 32 for applying a desired current to the semiconductor laser device 31. The stripe width and current source features shown in FIG. 4 are applicable to each of the semiconductor laser devices in FIGS. 1–3.

Other Matters

The wavelength conversion apparatuses as the first to third embodiments may further comprise a temperature control mechanism (not shown) for stabilizing phase matching of the wavelength conversion elements against variation of environmental conditions, for example, by utilizing the Peltier effect. In addition, the wavelength conversion apparatuses as the first to third embodiments may further comprise a heatsink (not shown) for radiating heat which is generated by the semiconductor optical amplifying elements and the semiconductor laser devices.

When a semiconductor optical amplifying element is used instead of the laser optical crystal, the second harmonic wave may become unstable depending on conditions of the driving current of the excitation light source. However, in this case, it is possible to stabilize the second harmonic wave by superimposing a high frequency wave on the driving current, or performing pulse-width modulation on the driving current. Therefore, there is practically no problem in using the semiconductor optical amplifying element instead of the laser optical crystal. In this case, it is rather advantageous that conversion efficiency of the wavelength conversion element is increased due to nonlinearity of conversion efficiency of the wavelength conversion element.

In addition, all of the contents of the Japanese patent application, No.11(1999)-61653 are incorporated into this specification by reference.

What is claimed is:

1. A wavelength conversion apparatus comprising:

an excitation light source which includes a semiconductor laser device having an active layer, and emits first laser light;

an optical amplifying element which is excited by the first laser light to emit second laser light;

a resonator formed by the optical amplifying element and a mirror arranged outside the optical amplifying element; and a wavelength conversion element arranged in the resonator;

wherein said optical amplifying element is a semiconductor optical amplifying element having an active layer on a substrate thereof.

2. A wavelength conversion apparatus according to claim 1, wherein a wavelength of the first laser light is shorter than a wavelength of the second laser light.

3. A wavelength conversion apparatus according to claim 1, wherein said mirror is a concave mirror, and is arranged so that a focal plane of light reflected by the mirror is located inside the semiconductor optical amplifying element.

4. A wavelength conversion apparatus according to claim 1, wherein said active layer of the semiconductor laser device is made of at least one of Al$_x$Ga$_{1-x}$As ($0 \leq x \leq 0.4$), GaAs$_x$P$_{1-x}$ ($0 \leq x \leq 0.4$), In$_x$Ga$_{1-x}$As$_y$P$_{1-y}$ ($0 \leq x \leq 0.4$, $0.7 \leq y \leq 1$), In$_x$Ga$_{1-x}$As ($0 \leq x \leq 0.5$), and In$_x$Al$_y$Ga$_{1-x-y}$As ($0 \leq x \leq 0.5$, $0 \leq y \leq 0.4$).

5. A wavelength conversion apparatus according to claim 1, wherein a stripe width of the active layer of the semiconductor laser device is at least 3 μm.

6. A wavelength conversion apparatus according to claim 1, wherein the active layer of the semiconductor optical amplifying element is made of at least one of direct gap semiconductor crystals of Al$_x$Ga$_{1-x}$As ($0 \leq x \leq 0.4$), GaAs$_x$P$_{1-x}$ ($0 \leq x \leq 0.4$), In$_x$Ga$_{1-x}$As$_y$P$_{1-y}$ ($0 \leq x \leq 0.4$, $0.7 \leq y \leq 1$), In$_x$Ga$_{1-x}$As ($0 \leq x \leq 0.5$), In$_x$Al$_y$Ga$_{1-x-y}$As ($0 \leq x \leq 0.5$, $0 \leq y \leq 0.4$), InP, and InAlGaAsP.

7. A wavelength conversion apparatus according to claim 1, wherein at least one active layer, including said active layer of the semiconductor optical amplifying element, is arranged at a location in which electric-field strength of a standing wave generated in the semiconductor optical amplifying element is great.

8. A wavelength conversion apparatus according to claim 1, wherein a dielectric film is provided on a light-exit end surface of the semiconductor optical amplifying element.

9. A wavelength conversion apparatus according to claim 8, wherein said dielectric film is made of at least one of SiO$_2$, Al$_2$O$_3$, TiO$_2$, SiN$_4$, and Si.

10. A wavelength conversion apparatus according to claim 8, wherein said dielectric film is formed by ECR (electron cyclotron resonance) sputtering.

11. A wavelength conversion apparatus according to claim 1, wherein said active layer of the semiconductor optical amplifying element is located only in a portion which said first laser light enters, and has a structure for blocking the first laser light from portions other than said portion.

12. A wavelength conversion apparatus according to claim 1, wherein the active layer of said semiconductor optical amplifying element has at least one quantum well structure.

13. A wavelength conversion apparatus according to claim 1, wherein a portion of said semiconductor optical amplifying element other than the active layer thereof is doped with impurity of at least $5 \times 10^{17}$ cm$^{-3}$ to make the portion a p type or an n type.

14. A wavelength conversion apparatus according to claim 1, wherein said semiconductor optical amplifying element has a periodic structure on a side, opposite to a light-exit end surface, of the active layer of the semiconductor optical amplifying element, where said periodic structure reflects light generated by the semiconductor optical amplifying element with high reflectance.

15. A wavelength conversion apparatus according to claim 14, wherein said periodic-structure is made of at least two semiconductor materials having different refraction indexes, and optical absorption coefficients of the at least two semiconductor materials are at most $5 \times 10^2$ for a wavelength of light generated in the semiconductor optical amplifying element.

16. A wavelength conversion apparatus according to claim 1, wherein said semiconductor optical amplifying element is supplied with the first laser light from a substrate side of the semiconductor optical amplifying element, and emits the second laser light from a side, opposite to the substrate, in a direction perpendicular to the substrate.

17. A wavelength conversion apparatus according to claim 16, wherein said semiconductor optical amplifying element has a dielectric film on a light-entrance side of the semiconductor optical amplifying element.

18. A wavelength conversion apparatus according to claim 16, wherein a reflectance of a light-entrance end surface of said semiconductor optical amplifying element is at most 30% at a wavelength of the first laser light, and at least 50% at a wavelength of the second laser light.

19. A wavelength conversion apparatus according to claim 16, wherein a reflectance of a light-exit end surface of said semiconductor optical amplifying element is at most 30% at a wavelength of the second laser light.

20. A wavelength conversion apparatus according to claim 1, wherein said semiconductor optical amplifying element emits the second laser light from a surface of the semiconductor optical amplifying element in a direction perpendicular to a substrate, and said first laser light enters the semiconductor optical amplifying element from said surface of the semiconductor optical amplifying element.

21. A wavelength conversion apparatus according to claim 20, wherein a reflectance of said surface of said semiconductor optical amplifying element is at most 30% at a wavelength of the first laser light, and at most 30% at a wavelength of the second laser light.

22. A wavelength conversion apparatus according to claim 20, wherein said first laser light enters the semiconductor optical amplifying element in a slanting direction with respect to the substrate of the semiconductor optical amplifying element.

23. A wavelength conversion apparatus according to claim 20, further comprising a beam splitter on an optical path of the second laser light, where the beam splitter supplies the first laser light to the semiconductor optical amplifying element in a direction perpendicular to the substrate of the semiconductor optical amplifying element.

24. A wavelength conversion apparatus according to claim 22, wherein said first laser light is incident on a light-entrance end surface of the semiconductor optical amplifying element as a substantially p-polarized light.

25. A wavelength conversion apparatus according to claim 22, wherein an incident angle of said first laser light on a light-entrance end surface of the semiconductor optical amplifying element is within ±10 degrees of a Brewster's angle.

26. A wavelength conversion apparatus according to claim 1, further comprising a filter in a common optical path of said second laser light and light which is reflected by the mirror and converted by the wavelength conversion element.

27. A wavelength conversion apparatus according to claim 26, wherein said filter is one of a birefringent filter, an etalon, and a dielectric filter.

28. A wavelength conversion apparatus according to claim 1, wherein a reflectance of a light-entrance end surface of said wavelength conversion element is at most 30% at a wavelength of the first laser light.

29. A wavelength conversion apparatus according to claim 1, wherein a reflectance of a light-exit end surface of said wavelength conversion element is at most 30% at a wavelength of wavelength-converted light which is generated by conversion by the wavelength conversion element.

30. A wavelength conversion apparatus according to claim 1, wherein said semiconductor laser device is driven by applying a direct current and a high-frequency current thereto.

31. A wavelength conversion apparatus according to claim 1, wherein said semiconductor laser device is driven by applying a pulsed current thereto.

32. A wavelength conversion apparatus according to claim 1, wherein said semiconductor laser device is driven by applying a direct current and a pulsed current thereto.

33. A wavelength conversion apparatus according to claim 1, wherein said semiconductor optical amplifying element is caused to emit the second laser light by applying a current thereto, in addition to supply of the first laser light thereto.

* * * * *